US009899188B2

(12) United States Patent
Amato et al.

(10) Patent No.: US 9,899,188 B2
(45) Date of Patent: Feb. 20, 2018

(54) SELECTIVE PROCESSING OF A WORKPIECE USING ION BEAM IMPLANTATION AND WORKPIECE ROTATION

(71) Applicant: Varian Semiconductor Equipment Associates, Inc., Gloucester, MA (US)

(72) Inventors: Mark R. Amato, South Hamilton, MA (US); William Davis Lee, Newburyport, MA (US); Jillian Reno, Beverly, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 125 days.

(21) Appl. No.: 14/807,411

(22) Filed: Jul. 23, 2015

(65) Prior Publication Data

US 2017/0025253 A1 Jan. 26, 2017

(51) Int. Cl.

| | |
|---|---|
| ***H01J 37/317*** | (2006.01) |
| ***H01L 21/265*** | (2006.01) |
| ***H01L 21/425*** | (2006.01) |
| ***H01J 37/08*** | (2006.01) |
| ***H01J 37/20*** | (2006.01) |
| ***H01J 37/302*** | (2006.01) |
| *C23C 14/48* | (2006.01) |

(52) U.S. Cl.

CPC .......... *H01J 37/3171* (2013.01); *H01J 37/08* (2013.01); *H01J 37/20* (2013.01); *H01J 37/3026* (2013.01); *H01L 21/265* (2013.01); *H01L 21/425* (2013.01); *C23C 14/48* (2013.01); *H01J 2237/20214* (2013.01); *H01J 2237/31761* (2013.01); *H01J 2237/31766* (2013.01)

(58) Field of Classification Search

None

See application file for complete search history.

(56) References Cited

U.S. PATENT DOCUMENTS 5,825,038 A * 10/1998 Blake .................. H01J 37/3007 250/492.21

6,833,552 B2 12/2004 Berrian (Continued)

OTHER PUBLICATIONS

Morgan D. Evans, Selective Processing of a Workpiece, U.S. Appl. No. 14/681,762, filed Apr. 8, 2015.

(Continued)

*Primary Examiner* — Wyatt Stoffa

*Assistant Examiner* — James Choi

(74) *Attorney, Agent, or Firm* — Nields, Lemack & Frame, LLC

(57) ABSTRACT

Systems and methods for the selective processing of a particular portion of a workpiece are disclosed. For example, the outer portion may be processed by directing an ion beam toward a first position on the workpiece, where the ion beam extends beyond the outer edge of the workpiece at two first locations. The workpiece is then rotated relative to the ion beam about its center so that certain regions of the outer portion are exposed to the ion beam. The workpiece is then moved relative to the ion beam to a second position and rotated in the opposite direction so that all regions of the outer portion are exposed to the ion beam. This process may be repeated a plurality of times. The ion beam may perform any process, such as ion implantation, etching or deposition.

20 Claims, 9 Drawing Sheets

31
42
41
40
15
44
43
20
16
13
17
10

(56) References Cited

U.S. PATENT DOCUMENTS

| | | | | |
|---|---|---|---|---|
| 7,544,957 | B2 | 6/2009 | Walther et al. | |
| 7,662,705 | B2 * | 2/2010 | Rouh | H01L 21/265<br>250/492.21 |
| 8,552,404 | B2 * | 10/2013 | Asai | H01J 37/09<br>250/492.1 |
| 8,980,654 | B2 * | 3/2015 | Ninomiya | H01L 21/265<br>250/423 R |
| 9,275,820 | B2 * | 3/2016 | Lee | H01J 27/022 |
| 2005/0250299 | A1 | 11/2005 | Sohn et al. | |
| 2008/0153275 | A1 * | 6/2008 | Rouh | H01L 21/265<br>438/527 |
| 2008/0283778 | A1 * | 11/2008 | Tomimatsu | H01J 37/045<br>250/492.21 |
| 2010/0099244 | A1 * | 4/2010 | Rouh | H01L 21/26513<br>438/527 |
| 2011/0248190 | A1 * | 10/2011 | Tanaka | H01J 37/20<br>250/492.21 |
| 2013/0295753 | A1 | 11/2013 | Hwang et al. | |
| 2015/0104885 | A1 | 4/2015 | Chang | |

OTHER PUBLICATIONS

International Search Report and Written Opinion dated Oct. 20, 2016 in corresponding PCT application No. PCT/US2016/041101.

* cited by examiner

SELECTIVE PROCESSING OF A WORKPIECE USING ION BEAM IMPLANTATION AND WORKPIECE ROTATION

Embodiments of the present disclosure relate to a method of selectively processing a workpiece, and more particularly, to selectively processing a particular portion of a semiconductor workpiece.

BACKGROUND

Improvement in yields for semiconductor devices is a continuous goal. One area that may be improved is process uniformity across the workpiece in the radial direction. In certain processes, the workpiece may receive more treatment near the center of the workpiece.

For example, a deposition process may deposit more material near the center of a workpiece than near the outer edge of that workpiece. This may be due to the increased plasma density near the center of the deposition chamber.

As another example, a heated implant may provide a different dose near the outer edge, since this outer edge of the workpiece may be somewhat cooler than the rest of the workpiece.

In another example, a spin coating process may leave more material near the outer edge of the workpiece, as compared to the center of the workpiece. This may be due to the centripetal force pushing the coating toward the outer edge of the workpiece.

In each of these examples, this process non-uniformity in the radial direction may negatively impact the yield of a semiconductor workpiece. In some cases, efforts are made to improve the uniformity of the process. However, there may be limits to the degree of uniformity that may be achieved.

Therefore, it would be beneficial if there were a method of selectively processing the outer portion of a workpiece. Further, it would be advantageous if this selective processing improved the overall process uniformity of the workpiece.

SUMMARY

Systems and methods for the selective processing of a particular portion of a workpiece are disclosed. For example, the outer portion may be processed by directing an ion beam toward a first position on the workpiece, where the ion beam extends beyond the outer edge of the workpiece at two first locations. The workpiece is then rotated relative to the ion beam about its center so that certain regions of the outer portion are exposed to the ion beam. The workpiece is then moved relative to the ion beam to a second position and rotated in the opposite direction so that all regions of the outer portion are exposed to the ion beam. This process may be repeated a plurality of times. The ion beam may perform any process, such as ion implantation, etching or deposition. In certain embodiments, the outer portion may be an annular ring having an outer diameter equal to that of the workpiece and having a width of 1 to 30 millimeters.

According to one embodiment, a method of processing a workpiece is disclosed. The method comprises rotating the workpiece about a center in a first direction while the ion beam is directed toward a first position, where the ion beam extends beyond an outer edge of the workpiece at two first locations and the first position is a predetermined distance from the outer edge of the workpiece, so as to process a portion of an outer portion of the workpiece; moving the workpiece relative to the ion beam so as to direct the ion beam toward a second position on the workpiece, where the ion beam extends beyond an outer edge of the workpiece at two second locations and the second position is the predetermined distance from the outer edge of the workpiece; and rotating the workpiece about the center in a second direction, opposite the first direction, while the ion beam is directed toward the second position, so as to process a remainder of the outer portion of the workpiece. In certain embodiments, the workpiece is rotated at least 180° in the first direction and at least 180° in the second direction. In certain embodiments, the ion beam does not impact the workpiece during the moving. In certain further embodiments, the ion beam is blocked or blanked during the moving.

According to another embodiment, an ion implantation system is disclosed. The ion implantation system comprises an ion source from which an ion beam is extracted; a platen, adapted to hold a workpiece, which is configured to move laterally and rotationally; a controller, in communication with the platen, and configured to: direct the ion beam toward a first position on the workpiece, where the ion beam extends beyond an outer edge of the workpiece at two first locations and the first position is a predetermined distance from the outer edge of the workpiece; rotate the workpiece about a center in a first direction while the ion beam is directed toward the first position, so as to process a portion of an outer portion of the workpiece; move the workpiece relative to the ion beam so as to direct the ion beam toward a second position on the workpiece, where the ion beam extends beyond an outer edge of the workpiece at two second locations and the second position is the predetermined distance from the outer edge of the workpiece; and rotate the workpiece about the center in a second direction, opposite the first direction, while the ion beam is directed toward the second position, so as to process a remainder of the outer portion of the workpiece, wherein a width of the outer portion is determined by the predetermined distance. In certain embodiments, the ion beam is prevented from impacting the workpiece while the workpiece is moved relative to the ion beam. In certain embodiments, the workpiece is rotated at a fixed rotational speed. In other embodiments, the workpiece is rotated at a varying rotational speed.

According to another embodiment, an ion implantation system is disclosed. The ion implantation system comprises an ion source from which an ion beam is extracted; a platen, adapted to hold a workpiece, which is configured to move laterally and rotationally; a controller, in communication with the platen, and configured to: direct the ion beam toward a first position on the workpiece, where the ion beam extends beyond an outer edge of the workpiece at two first locations and the first position is a predetermined distance from the outer edge of the workpiece; rotate the workpiece 180° about a center in a first direction while the ion beam is directed toward the first position, so as to process a portion of an outer portion of the workpiece; prevent the ion beam from impacting the workpiece while moving the workpiece relative to the ion beam so as to direct the ion beam toward a second position on the workpiece, where the ion beam extends beyond an outer edge of the workpiece at two second locations and the second position is the predetermined distance from the outer edge of the workpiece; and rotate the workpiece 180° about the center in a second direction, opposite the first direction, while the ion beam is directed toward the second position, so as to process a remainder of the outer portion of the workpiece, wherein a width of the outer portion is determined by the predetermined distance. In certain embodiments, the ion source comprises one or more electrodes to manipulate the ion beam, and the controller modifies a voltage applied to the one or more electrodes to prevent the ion beam from impacting the workpiece. In certain embodiments, the ion implantation system further comprises a Faraday cup or a shadow mask, wherein the controller moves the Faraday cup or the shadow mask in a path of the ion beam to prevent the ion beam from impacting the workpiece.

BRIEF DESCRIPTION OF THE FIGURES

For a better understanding of the present disclosure, reference is made to the accompanying drawings, which are incorporated herein by reference and in which.

DETAILED DESCRIPTION

As described above, processes are often non-uniform along the radial direction, leading to different characteristics across the semiconductor workpiece. Further, in certain processes, elimination of this non-uniformity may be difficult. For example, deposition processes may deposit more material near the center of the workpiece, due to increased plasma density in this region. Creation of a plasma that is completely uniform across the workpiece in the radial direction may be challenging.

Therefore, it may be advantageous to develop a system and method of selectively processing the outer portion of a workpiece. In some embodiments, this selective processing may be to compensate for a known process non-uniformity. For example, in the above deposition example, the selective processing may be used to deposit additional material along the outer portions of the workpiece. In other embodiments, this selective processing may be used to counteract the known process non-uniformity. For example, a certain process may treat the outer portion of the workpiece to a greater extent than the center of the workpiece. In this scenario, the selective processing may be a different process, which counteracts the effect of the first process. For example, if a deposition process deposited more material near the outer portion of the workpiece, a selective etching process may be used to remove material from the outer portion, creating a more uniform deposition layer.

Of course, deposition is not the only process that may be non-uniform. Ion implantation and etching processes may also possess a certain degree of non-uniformity along the radial direction.

This selective processing serves to treat only a portion of the workpiece, such as, for example, the outer portion of the workpiece. The outer portion may be an annular ring, where the outer dimension of that annular ring is the circumference of the workpiece. For example, if the workpiece has a diameter of 300 mm, the annular ring may have an outer diameter of 300 mm and an inner diameter that is somewhat less than 300 mm. The annular ring may be tens of millimeters in width, or may be only a few millimeters. In other words, the width of the annular ring may vary and is not limited by this disclosure.

Figure 1A:
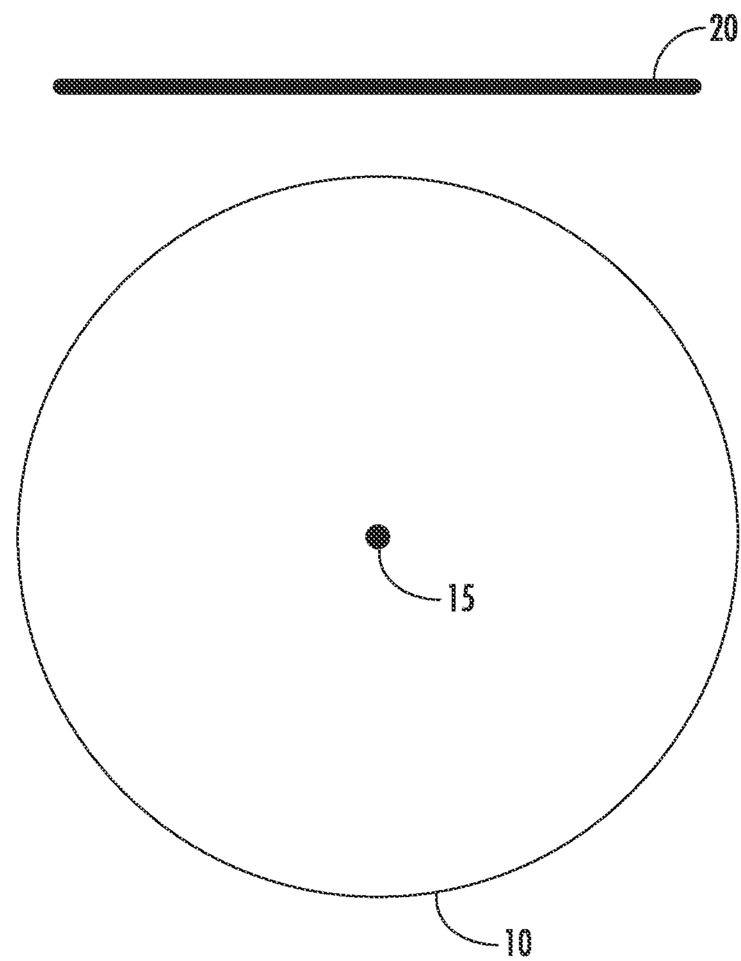
FIGS. 1A-1F show a sequence that performs selective processing of the outer portion of a workpiece.

FIGS. 1A-1F show a sequence of illustrations depicting a selective processing of the outer portion of a workpiece. In FIG. 1A, an ion beam 20 is shown. The ion beam 20 may be a ribbon ion beam, having a length that is much greater than its width. For example, the length of the ion beam 20 may be several hundred millimeters, while the width of the ion beam 20 may be about ten millimeters. The ion beam 20 may be straight along the length direction. Of course, other dimensions may also be used and are within the scope of the disclosure. In other embodiments, the ion beam 20 may be a scanned spot ion beam, which is scanned in the length direction. By scanning the spot ion beam in the length direction, the spot ion beam may behave similar to a ribbon ion beam. Thus, throughout this disclosure, it is understood that ion beam 20 may be a ribbon ion beam or a scanned spot beam. A workpiece 10 is also shown. In the initial position, the workpiece 10 is not exposed to the ion beam 20.

Figure 1B:
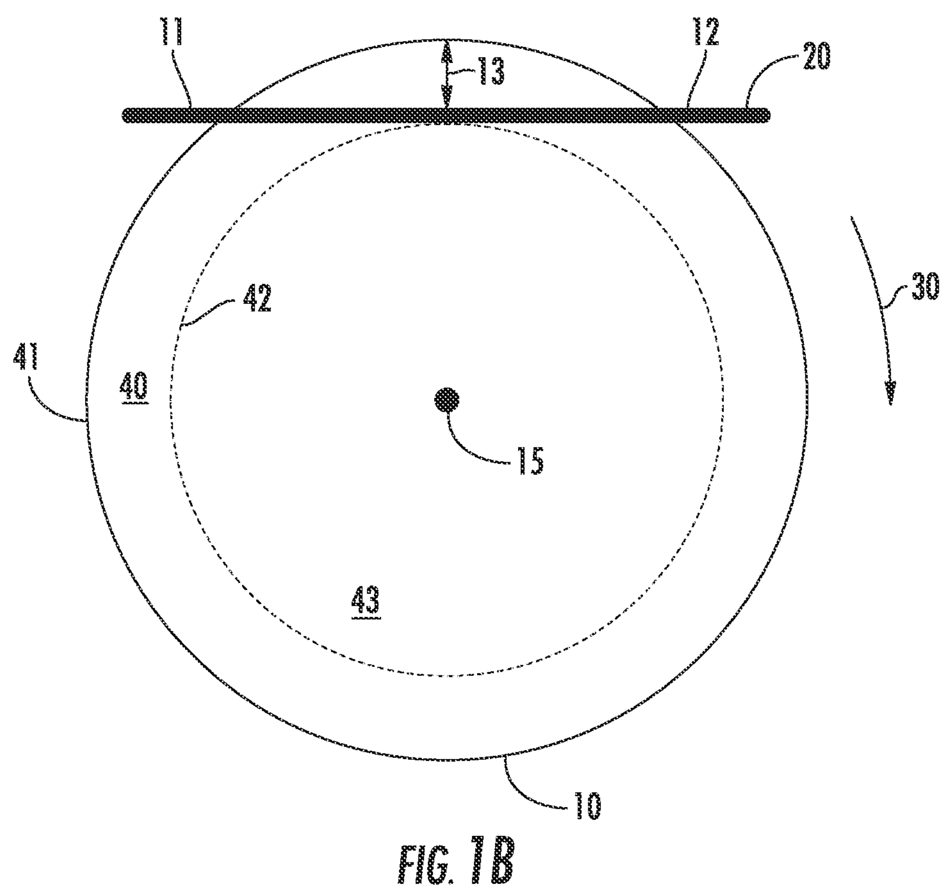

In FIG. 1B, the workpiece 10 is moved relative to the ion beam 20, such that the ion beam 20 extends across the workpiece 10, forming the geometric line referred to as a first chord. The ion beam 20 is directed toward a first position on the workpiece 10, forming the first chord that is a predetermined distance from the outer edge of the workpiece 10. The ion beam 20 extends beyond the workpiece 10 at two first locations 11, 12 in the length direction. In some embodiments, the distance between the two first locations 11, 12 is less than the overall length of the ion beam 20. In some embodiments, the ion beam 20 may have some non-uniformity near the outer edges in the length direction. Thus, by using the portion of the ion beam 20 between the two first locations 11, 12, this non-uniformity of the ion beam 20 may be avoided.

Because the ion beam 20 is straight and the outer edge of the workpiece 10 is arced, the distance between the ion beam 20 and the outer edge of the workpiece 10 varies. The ion beam 20 is disposed a maximum distance 13 from the outer edge of the workpiece 10. This maximum distance 13 occurs at the midpoint of the first chord between the two first locations 11, 12 and is measured perpendicular to the longer dimension of the ion beam 20. This maximum distance 13 is less than the radius of the workpiece 10. In some embodiments, the maximum distance 13 is much less than the radius of the workpiece 10. For example, in some embodiments, the maximum distance 13 may be between 1 and 30 mm. Further, the maximum distance 13 and the circumference of the workpiece 10 define the outer portion that will be selectively processed. This outer portion 40 may be an annular ring having an outer diameter 41 equal to the diameter of the workpiece 10 and an inner diameter 42 equal to the diameter of the workpiece 10, less two times the maximum distance 13. In other words, the outer portion 40 is an annular ring having a width equal to the maximum distance 13 and an outer diameter equal to the diameter of the workpiece 10. Thus, in some embodiments, the annular ring has a width of between 1 and 30 mm. In certain embodiments, the annular ring has a width less than the radius of the workpiece 10.

Once the ion beam 20 is directed toward the workpiece 10, the workpiece 10 is then rotated about the center 15 in first direction 30. The workpiece 10 may be rotated through a portion of a complete rotation, such as an angle of 180°, although any rotation greater than or equal to 180° may be used. The workpiece 10 may be rotated at any suitable rotational speed, such as between 10 seconds per rotation and 2 minutes per rotation, although other rotational speeds may be used. As the workpiece 10 is rotated in first direction 30, a different region of the outer portion 40 is exposed to the ion beam 20.

In certain embodiments, the workpiece 10 may be rotated at a constant rotational speed. However, in other embodiments, the rotational speed may vary as a function of time or position of the workpiece 10. For example, in certain embodiments, the workpiece 10 may have azimuthal non-uniformities. In this disclosure, "azimuthal non-uniformities" refers to the non-uniformities that exist at a specific radius but at a different rotational direction. In other words, the workpiece 10 may have non-uniformity in the radial direction, but may also have non-uniformity at a particular radius at different rotational angles, or may have non-uniformity in both directions. In these embodiments, varying the rotational speed may allow uneven processing of the outer portion 40. For example, slowing the rotational speed may allow more processing of a particular region of the outer portion 40 of the workpiece 10.

Figure 1C:
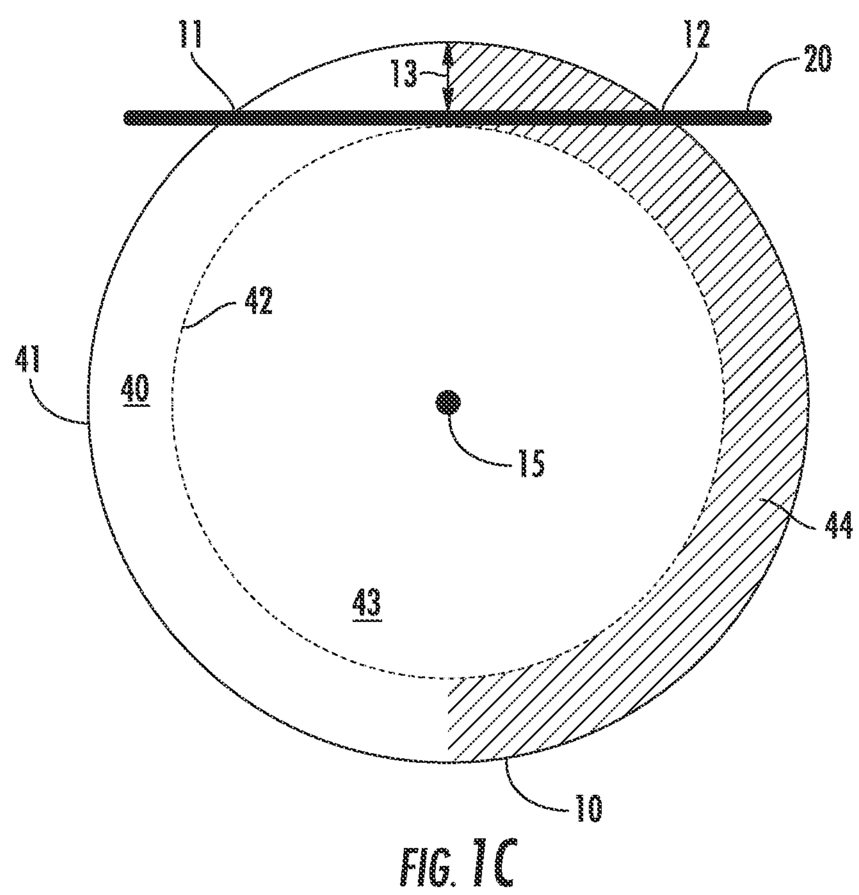

FIG. 1C shows the workpiece 10 and the ion beam 20 after the workpiece 10 has been rotated 180°. At this point in time, half of the outer portion 40 has been implanted to form processed portion 44. Following this rotation, the workpiece 10 is then moved laterally relative to the ion beam 20. In certain embodiments, the ion beam 20 is moved while the workpiece 10 remains stationary. In other embodiments, the workpiece 10 is moved while the ion beam 20 remains stationary. In other embodiments, both the workpiece 10 and the ion beam 20 are moved.

Figure 1D:
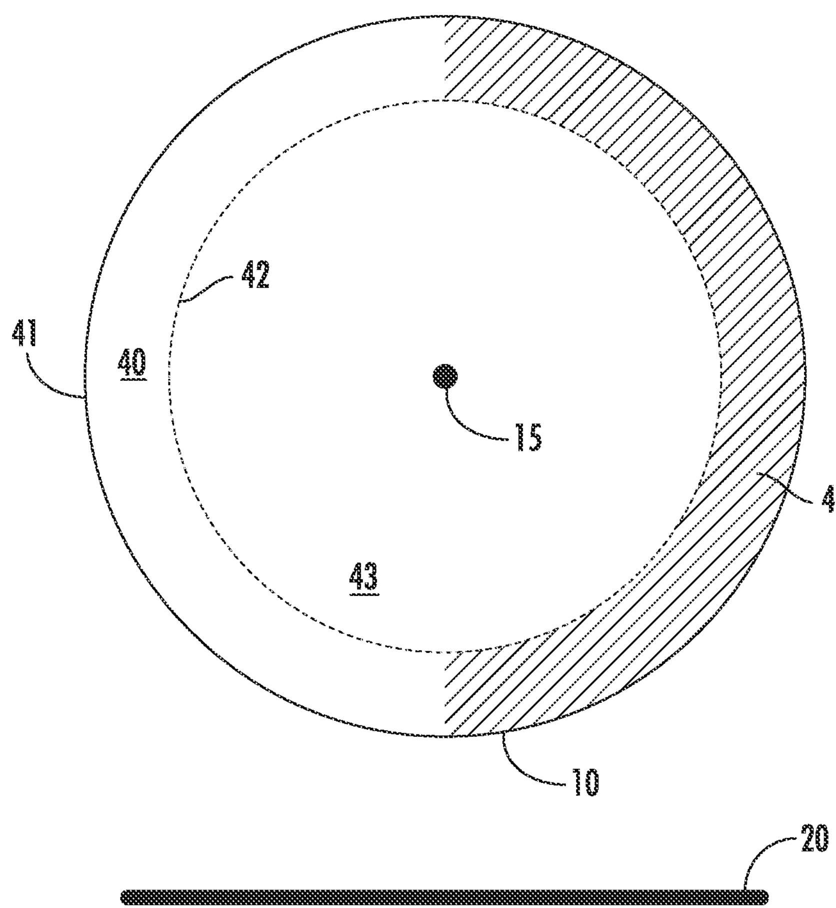

FIG. 1D shows the configuration of the workpiece 10 and the ion beam 20 after this relative motion. The center 15 of the workpiece 10 is now on the opposite side of the ion beam 20, as compared to FIG. 1A. In other words, if the center 15 of the workpiece 10 is beneath the ion beam 20 in FIG. 1A, the center 15 of the workpiece 10 would be above the ion beam 20 in FIG. 1D. Alternatively, if the process began with the center 15 of the workpiece 10 above the ion beam 20 in FIG. 1A, the center 15 of the workpiece 10 would be beneath the ion beam 20 in FIG. 1D. Thus, the lateral movement causes the center 15 of the workpiece 10 to be disposed on an opposite side of the ion beam 20, as compared to the starting position.

Figure 1E:
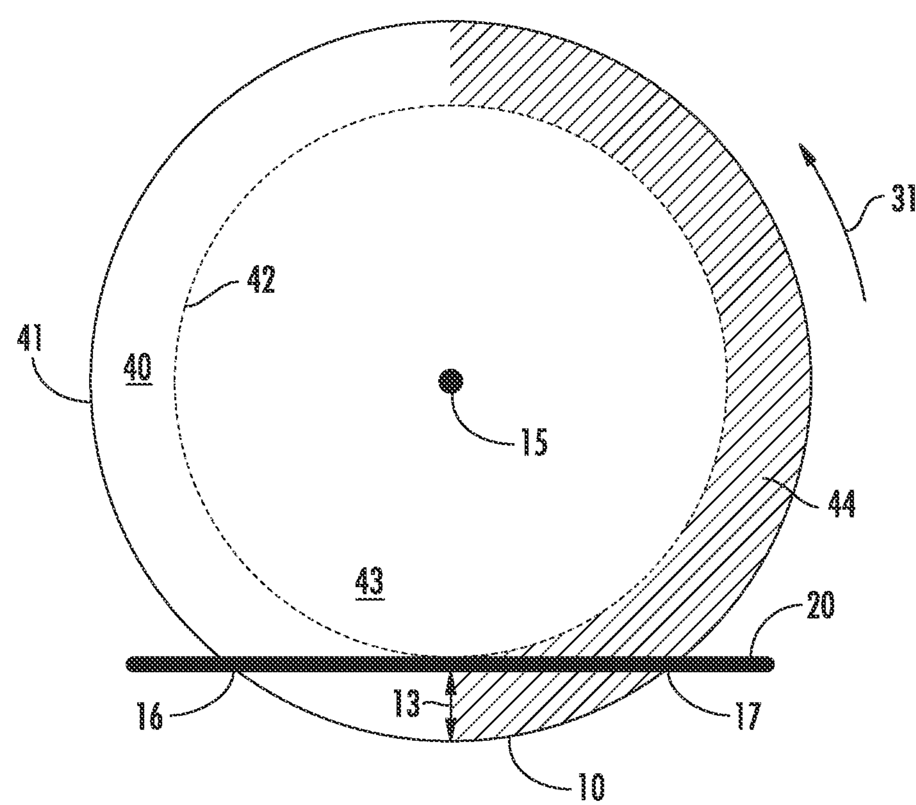

In FIG. 1E, the workpiece 10 is moved relative to the ion beam 20, such that the ion beam 20 extends across the workpiece 10, forming the geometric line referred to as a second chord. The ion beam 20 is directed toward a second position on the workpiece 10, forming the second chord that is the predetermined distance from the outer edge of the workpiece 10. This predetermined distance from the outer edge is the same as that used in the first position. The ion beam 20 extends beyond the workpiece 10 at two second locations 16, 17 in the length direction. Because, the ion beam 20 is straight and the outer edge of the workpiece 10 is arced, the distance between the ion beam 20 and the outer edge of the workpiece 10 varies. The ion beam 20 is disposed a maximum distance 13 from the outer edge of the workpiece 10. In other words, the ion beam 20 is positioned such that the ion beam 20 touches the inner diameter 42 of the outer portion 40. In certain embodiments, the first chord and the second chord may be parallel to one another.

After the workpiece 10 and the ion beam 20 are oriented as shown in FIG. 1E, the workpiece 10 is rotated about the center 15 in second direction 31, which is the opposite of first direction 30 used in FIG. 1B. In other words, if first direction 30 is clockwise, second direction 31 is counterclockwise. Conversely, if first direction 30 is counterclockwise, second direction 31 is clockwise. Rotation in second direction 31 may create a processed portion 44 that surrounds the entirety of the center portion 43.

Figure 1F:
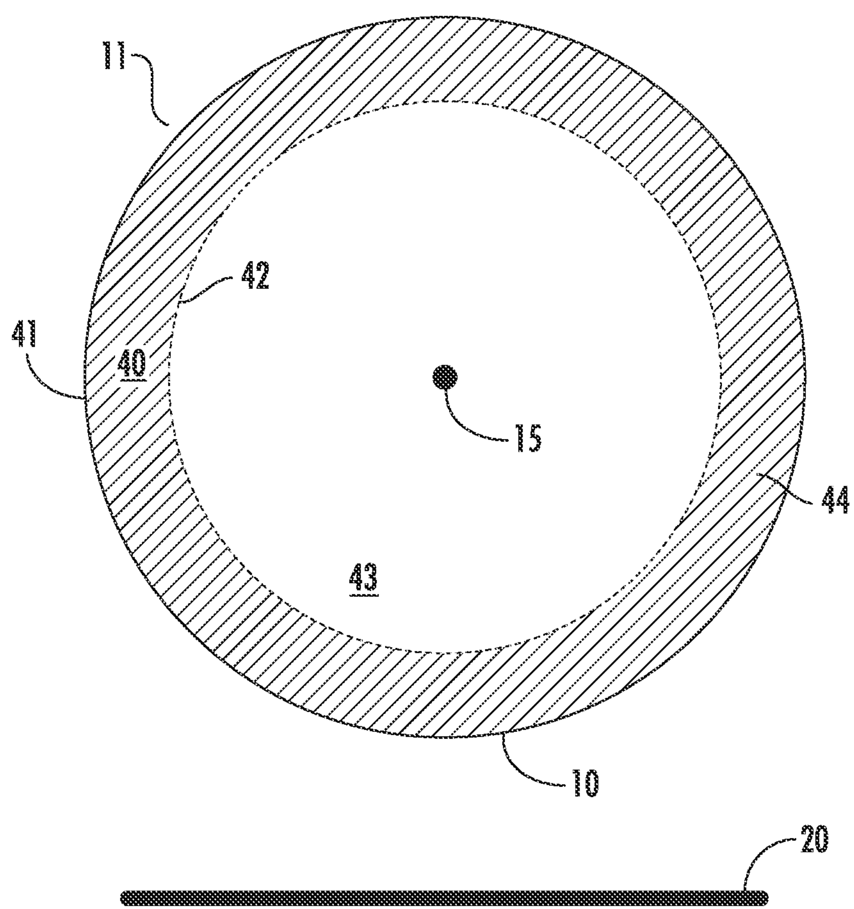

After the workpiece has rotated in second direction 31, the workpiece 10 may be moved relative to the ion beam 20, as shown in FIG. 1F or in FIG. 1A. Note that in certain embodiments, the workpiece 10 may move directly from the position shown in FIG. 1C to that shown in FIG. 1E. Similarly, the workpiece 10 may more directly from the position shown in FIG. 1E to that shown in FIG. 1B. In other words, in certain embodiments, the position of the ion beam 20 may oscillate between the positions shown in FIGS. 1B and 1E. In certain embodiments, this distance between these two positions may be given by the diameter of the workpiece 10, less twice the maximum distance 13.

In this sequence of illustrations, it is assumed that the angle of rotation in first direction 30 is 180° and, similarly, the angle of rotation in second direction 31 is also 180°, such that the entire outer portion 40 is equally exposed to the ion beam 20 to create processed portion 44.

In certain embodiments, such as that shown in FIGS. 1A-1F, the angle of rotation in second direction 31 may be the same as the angle of rotation in first direction 30. In these embodiments, the workpiece 10 may be returned to the same orientation in FIG. 1F that the workpiece 10 began in during FIG. 1A. In embodiments where the platen is only capable of limited rotational motion, this embodiment allows the entirety of the outer portion 40 to be processed using a platen that is capable of at least 180° of rotational movement. Thus, a platen that is not capable of 360° of rotation may still be utilized to perform this selective processing.

While FIGS. 1A-1F show an angle of rotation of 180°, other embodiments are also within the scope of the disclosure. For example, if the angle of rotation in first direction 30 and in second direction 31 are both 270°, repeating the sequence shown in FIGS. 1A-1F twice would cause the workpiece 10 to complete 3 full rotations. Similarly, if the angle of rotation in first direction 30 and in second direction 31 are both 240°, repeating the sequence shown in FIGS. 1A-1F three times would cause the workpiece 10 to complete 4 full rotations. In addition, the entirety of this sequence does not have to be repeated an integral number of times. For example, using an angle of rotation of 240°, if the sequence shown in FIGS. 1A-1F is performed once, followed by the sequence shown in FIGS. 1A-1C, the workpiece 10 would have completed 2 full rotations.

Thus, in some embodiments, the sequence shown in FIGS. 1A-1F may be repeated an integral number of times, such that there are an equal number of rotations in first direction 30 and in second direction 31. In other embodiments, the sequence shown in FIGS. 1A-1C is repeated one more time than the sequence shown in FIGS. 1D-1F, such that the number of rotations in first direction 30 is one more than the number of rotations in second direction 31.

Note that to move the workpiece 10 relative to the ion beam 20, as in between FIGS. 1C and 1D and between FIGS. 1F and 1A, the ion beam 20 may pass over the workpiece 10. In certain embodiments, this relative movement may cause ions from the ion beam 20 to impact the center portion 43 of the workpiece 10. In some embodiments, this exposure of the center portion 43 to the ion beam 20 may be unwanted.

Therefore, in certain embodiments, the effects of this relative movement are mitigated. For example, in one embodiment, the workpiece 10 is moved rapidly from the position shown in FIG. 1C to the position shown in FIG. 1D or FIG. 1E and from position shown in FIG. 1F to the position shown in FIG. 1A or FIG. 1B. For example, the workpiece 10 may be moved at 45 cm/sec or any other suitable speed. This may reduce the amount of ions that impact the center portion 43 of the workpiece 10. In other embodiments, the ion beam 20 may be physically blocked during this relative movement. For example, a shadow mask or a Faraday cup may be disposed between the source of the ion beam 20 and the workpiece 10 to stop the ion beam 20 from reaching the workpiece 10. In yet other embodiments, the ion beam 20 may be blanked. The ion beam 20 may be blanked using various techniques, described in more detail below.

After each complete rotation, all regions of the outer portion 40 will be equally exposed to the ion beam 20. Meanwhile the center portion 43 of the workpiece 10, which is a circle, having center 15 and an outer diameter that is equal to the inner diameter 42 of the outer portion 40, may not be exposed to the ion beam 20 at all. The speed and number of rotations determines the amount of processing that the outer portion 40 receives. After the target number of rotations has been completed, the sequence stops.

While FIGS. 1A-1F show the first position being near the top of the workpiece 10, and the second position being near the bottom of the workpiece 10, other embodiments are also possible. For example, the first position may be near the bottom, the left side or the right side. Similarly, the second position may be near the top, the right side or the left side. The first and second positions may be disposed anywhere on the workpiece 10, as long as the sequence shown in FIGS. 1A-1F processes the entirety of the outer portion 40. Thus, FIGS. 1A-1F are illustrative and are not meant to limit the disclosure.

The selective processing of the outer portion 40 of the workpiece 10 may be performed using any suitable ion beam implantation system.

Figure 2:
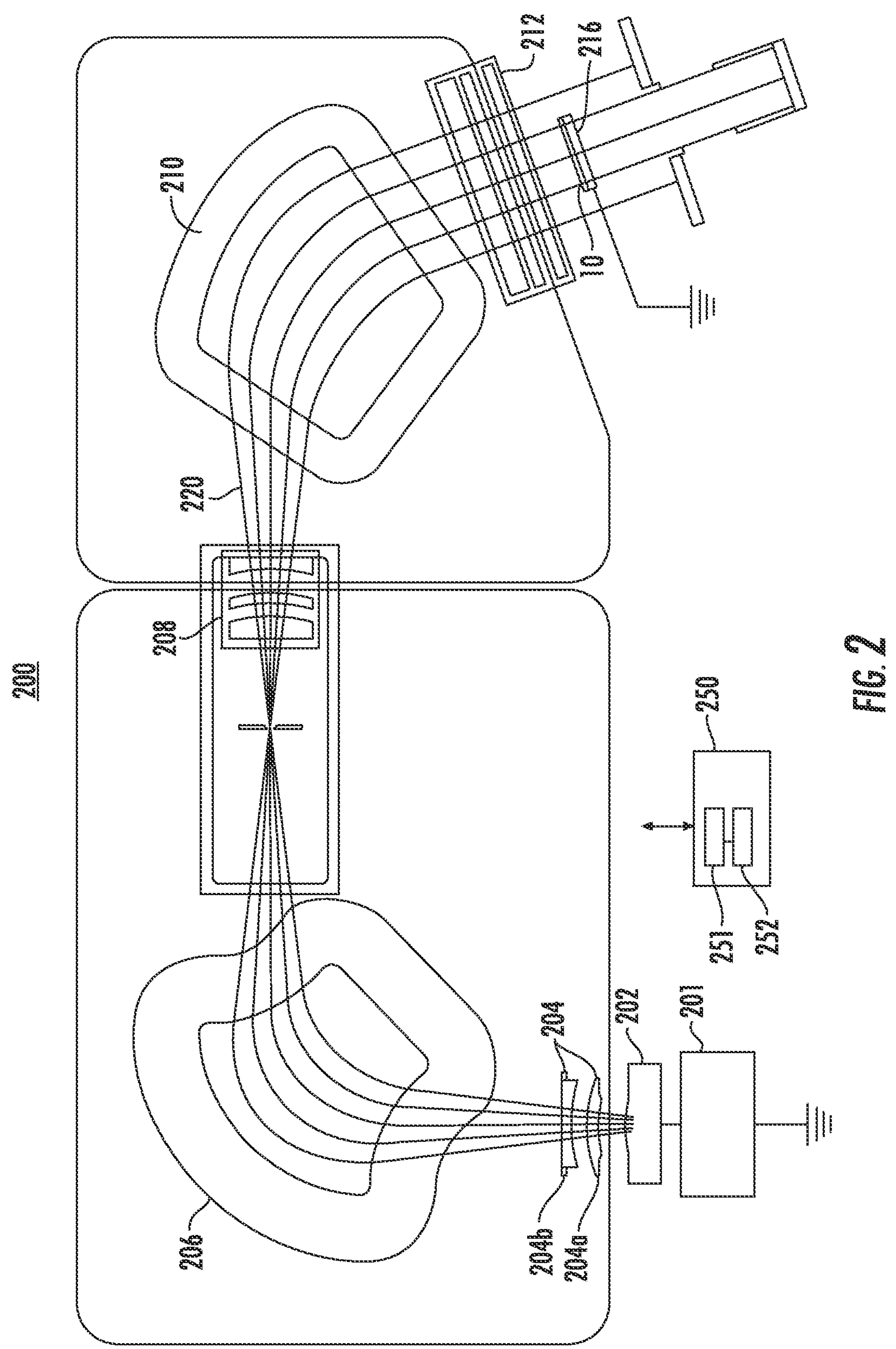
FIG. 2 is an ion implantation system in accordance with one embodiment that may be used to perform the selective processing of FIGS. 1A-1F.

FIG. 2 shows a beamline ion implantation system 200 that may be used to perform the selective processing of the outer portion 40. As illustrated in the figure, the beamline ion implantation system 200 may comprise an ion source and a complex series of beam-line components through which an ion beam 220 passes. The ion source may comprise an ion source chamber 202 where ions are generated. The ion source may also comprise a power source 201 and extraction electrodes 204 disposed near the ion source chamber 202. The extraction electrodes 204 may include a suppression electrode 204*a* and a ground electrode 204*b*. Each of the ion source chamber 202, the suppression electrode 204*a*, and the ground electrode 204*b* may include an aperture. The ion source chamber 202 may include an extraction aperture (not shown), the suppression electrode may include a suppression electrode aperture (not shown), and a ground electrode may include a ground electrode aperture (not shown). The apertures may be in communication with one another so as to allow the ions generated in the ion source chamber 202 may pass through, toward the beam-line components.

The beamline components may include, for example, a mass analyzer 206, a first acceleration or deceleration (A1 or D1) stage 208, a collimator 210, and a second acceleration or deceleration (A2 or D2) stage 212. Much like a series of optical lenses that manipulate a light beam, the beamline components can filter, focus, and manipulate ions or ion beam 220. The ion beam 220 that passes through the beamline components may be directed toward the workpiece 10 that is mounted on a platen 216 or clamp. The ion beam 220 may be a ribbon ion beam having a length much greater than its height. In other embodiments, the ion beam 220 may be a spot ion beam. In these embodiments, a scanner may be disposed before the workpiece 10 to scan the spot beam in the length direction. The workpiece 10 may be moved in one or more dimensions by an apparatus, sometimes referred to as a "roplat." The roplat may be configured to rotate the workpiece 10 about the center of the workpiece, as shown in FIG. 1B. Further, the roplat may be configured to move the workpiece 10 so that the ion beam 220 is directed to a specific region of the workpiece, such as is shown in FIG. 1B and FIG. 1E.

A controller 250 may be used to control the operation of the beamline ion implantation system 200. The controller 250 may include a processing unit 251 and a storage element 252. The storage element 252 may be any suitable non-transitory memory device, such as semiconductor memory (i.e. RAM, ROM, EEPROM, FLASH RAM, DRAM, etc), magnetic memory (i.e. disk drives), or optical memory (i.e. CD ROMs). The storage element 252 may be used to contain the instructions, which when executed by the processing unit 251 in the controller 250, allow the beamline ion implantation system 200 to perform the sequence shown in FIGS. 1A-1F.

Figure 3:
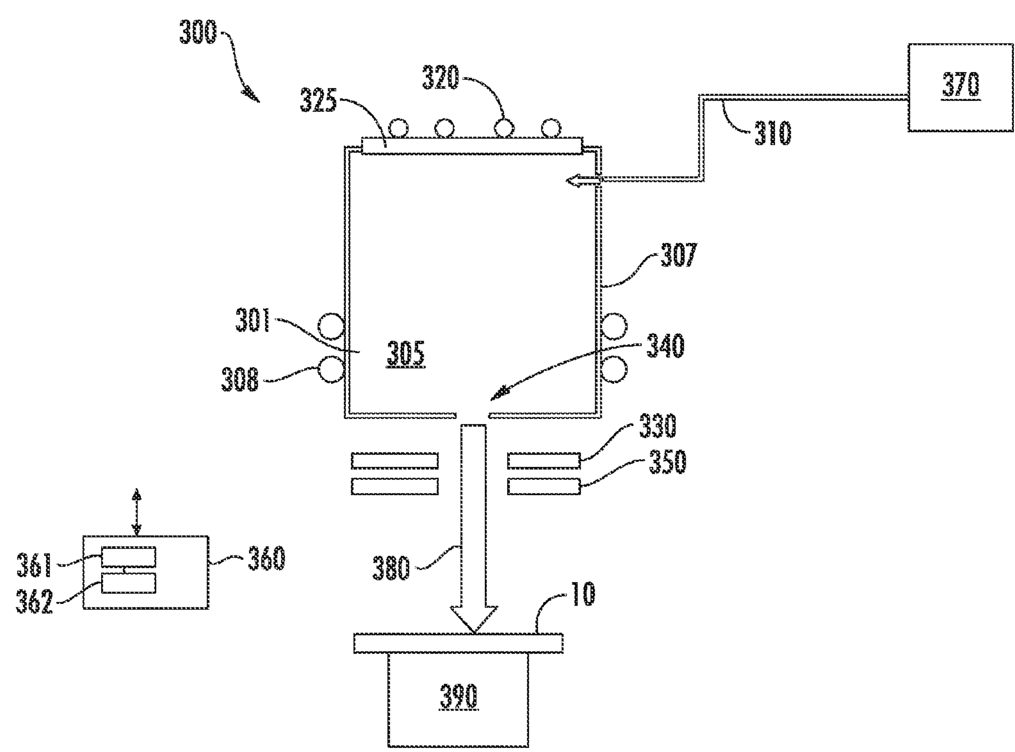
FIG. 3 is an ion implantation system in accordance with another embodiment that may be used to perform the selective processing of FIG. 1A-1F.

FIG. 3 shows another embodiment of an ion implantation system 300 that may be used to perform the selective processing of the outer portion 40. There is an ion source 301. This ion source 301 includes a plasma chamber 305 defined by plasma chamber walls 307, which may be constructed from graphite or another suitable material. This plasma chamber 305 may be supplied with one or more source gasses, stored in one or more source gas containers, such as a source gas container 370, via a gas inlet 310. This source gas may be energized by an RF antenna 320 or another plasma generation mechanism; for example but not limited to an indirectly heated cathode, or a hot filament. The RF antenna 320 is in electrical communication with a RF power supply (not shown) which supplies power to the RF antenna 320. A dielectric window 325, such as a quartz or alumina window, may be disposed between the RF antenna 320 and the interior of the ion source 301. The ion source 301 also includes an aperture 340 through which ions may pass. A negative voltage is applied to extraction suppression electrode 330 disposed outside the aperture 340 to extract the positively charged ions in the form of an ion beam 380 from within the plasma chamber 305 through the aperture 340 and toward the workpiece 10. A ground electrode 350 may also be employed. In some embodiments, the aperture 340 is located on the side of the ion source 301 opposite the side containing the dielectric window 325.

Additionally, electromagnets 308 may be disposed around the plasma chamber walls 307. These electromagnets 308 may be used to manipulate the plasma within the plasma chamber 305, so as to alter the shape or density of the ion beam 380 extracted from the plasma chamber 305.

A controller 360 may be used to control the operation of the ion implantation system 300. The controller 360 may include a processing unit 361 and a storage element 362. The storage element 362 may be any suitable non-transitory memory device, such as semiconductor memory (i.e. RAM, ROM, EEPROM, FLASH RAM, DRAM, etc), magnetic memory (i.e. disk drives), or optical memory (i.e. CD ROMs). The storage element 362 may be used to contain the instructions, which when executed by the processing unit 361 in the controller 360, allow the ion implantation system 300 to perform the sequence shown in FIGS. 1A-1F.

The workpiece 10 may be disposed on a platen 390, which may be capable of rotation and linear motion. The platen 390 may be configured to rotate as shown in FIG. 1B.

Figure 4:
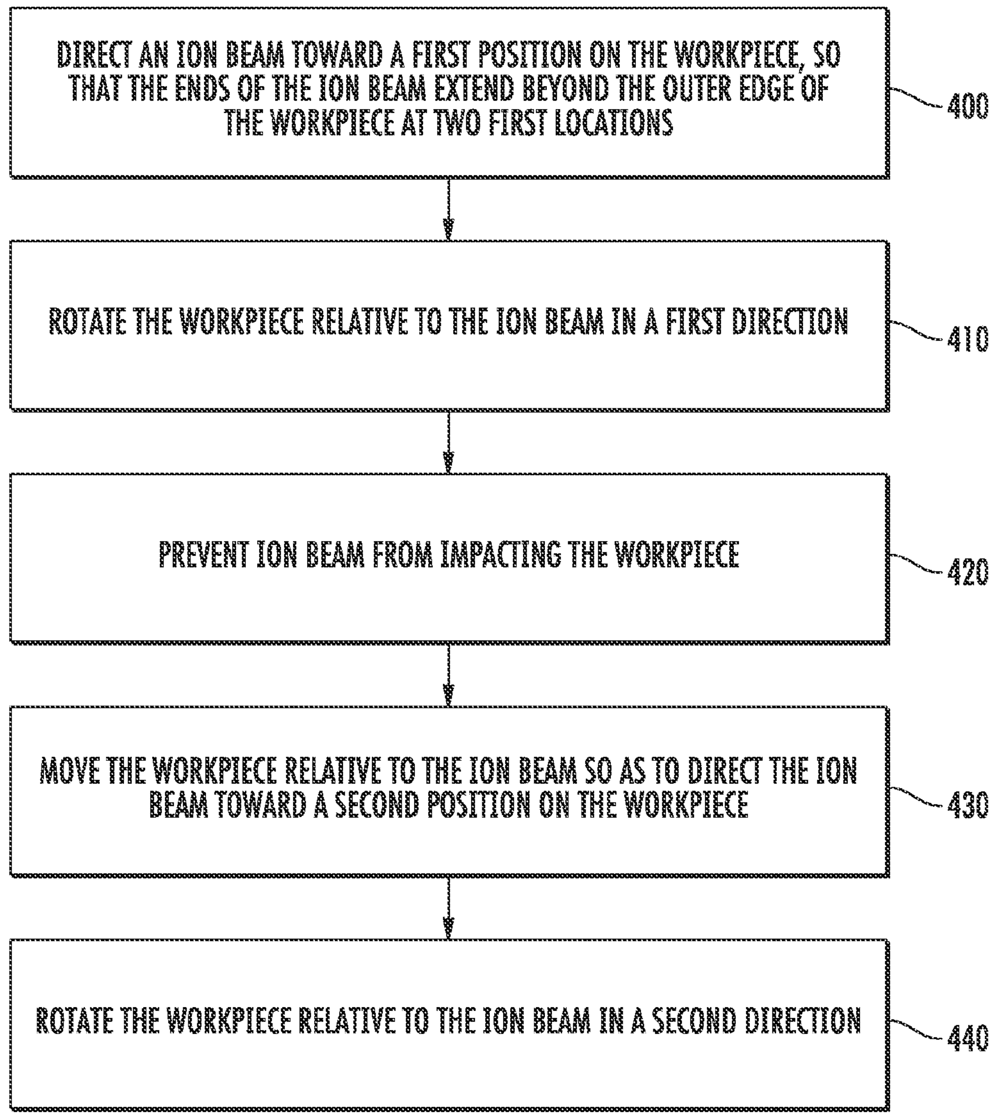
FIG. 4 shows a flowchart that may be used for selective processing of a portion of a workpiece.

FIG. 4 shows a flowchart of the process described herein. This process may be executed by the controller 250 in conjunction with the beamline ion implantation system 200 of FIG. 2. Alternatively, this process may be executed by the controller 360 in conjunction with the ion implantation system 300 of FIG. 3. Thus, in certain embodiments, a software program, comprising a set of instructions, may be loaded into the non-transitory storage element in the controller, to allow this sequence to be performed.

First, as shown in Process 400, the workpiece 10 is moved to that the ion beam 20 may be directed toward a first position on the workpiece. This first position may be a predetermined distance from an outer edge of the workpiece. Further, the ion beam may extend beyond the outer edge of the workpiece at two first locations. This may be accomplished by actuating the roplat that controls platen 216 in the beamline ion implantation system 200, or by actuating platen 390 in the ion implantation system 300.

Once the ion beam is directed toward the first position, the controller may cause the platen to rotate about the center of the workpiece, as shown in Process 410. Again, this may be achieved by actuating the roplat in the embodiment shown in FIG. 2, or by actuating the platen 390 in the embodiment shown in FIG. 3. The workpiece 10 is rotated in a first direction, such as clockwise.

After the workpiece 10 has moved through a predetermined angle of rotation, the controller may cause the ion beam to stop impacting the workpiece 10, as shown in Process 420. This may be performed in a number of different ways.

First, the ion beam may be blocked. For example, the controller may cause an actuator to move a Faraday cup or a shadow mask in the path of the ion beam 20 so that the ion beam 20 does not reach the workpiece 10. This approach is referred to as blocking the ion beam.

Alternatively, the ion beam may be blanked. This refers to the manipulation of the ion implantation system such that the ion beam does not impact the workpiece 10. For example, in the embodiment shown in FIG. 2, this may be done in a number of ways. In certain embodiments, the voltage applied to the extraction electrode 204 may be modified to reduce the current of the ion beam exiting the ion source chamber 202. In certain embodiments, the voltage applied to the first acceleration or deceleration (A1 or D1) stage 208, or a second acceleration or deceleration (A2 or D2) stage 212 may be modified to reduce the ion beam current. In certain embodiments, the flow of gas into the ion source chamber 202 may be slowed or stopped.

In the embodiment shown in FIG. 3, blanking of the ion beam may be done in a number of ways as well. In certain embodiments, the voltage applied to the extraction suppression electrode 330 may be modified to reduce the current of the ion beam exiting the plasma chamber 305. In certain embodiments, the flow of gas from source gas container 370 may be slowed to reduce the current of the ion beam 380.

In certain embodiments, the ion beam 20 may be allowed to impact the workpiece while moving from the first position to the second position. The effect of this may be minimized by moving the platen rapidly relative to the ion beam, such as at 45 cm/sec or another suitable speed.

The workpiece 10 is then moved relative to the ion beam 20 to a second position, as shown in Process 430. The second position may be on the opposite side of the center of the workpiece 10, and may be the same predetermined distance from the outer edge as the first position. In other words, in certain embodiments, the workpiece 10 may be moved by a distance equal to the diameter of the workpiece 10, less twice the predetermined distance. In certain embodiments, such as those shown in FIGS. 1A-1F, the ion beam 20, when in the first position, may be parallel to the ion beam 20, when in the second position. The workpiece 10 may be moved by actuating the platen 390 (see FIG. 3) or the platen 216 (see FIG. 2).

After the workpiece 10 has been moved relative to the ion beam 20, the ion beam, if previously prevented from impacting the workpiece, is now enabled. The workpiece 10 is then rotated in a second direction, opposite the first direction, as shown in Process 440. As before, this may be achieved to controlling the roplat in the embodiment of FIG. 2, or rotating the platen 390 in the embodiment of FIG. 3. The workpiece may be rotated by a predetermined angle of rotation, which may be the same as the predetermined angle of rotation used in Process 410.

The sequence shown in FIG. 4 may be repeated a plurality of times to perform the desired selective processing. If the sequence is repeated, the ion beam may be prevented from striking the workpiece as the sequence moves from Process 440 to Process 400, by blocking or blanking the ion beam, as described above. As described above, in certain embodiments, Process 410 may be performed one more time than Process 440.

In a variation of FIG. 4, it is also possible to move the workpiece laterally during Process 410 or Process 440. For example, the sequence shown in FIG. 4 results an the uniform processing of an outer region, in the shape of an annular ring having a constant width. If the workpiece is moved laterally during Process 410 or Process 440, the shape of the outer region may be altered. The term "laterally" is used to represent the direction perpendicular to the length (i.e. longer dimension) of the ion beam 20.

In summary, the method includes rotating the workpiece about a center in a first direction while the ion beam is directed toward a first position, where the ion beam extends beyond an outer edge of the workpiece at two first locations and the first position is a predetermined distance from the outer edge of the workpiece, so as to process a portion of an outer portion of the workpiece. After the rotating in the first direction is complete, the workpiece is moved relative to the ion beam so as to direct the ion beam toward a second position on the workpiece, where the ion beam extends beyond an outer edge of the workpiece at two second locations and the second position is the predetermined distance from the outer edge of the workpiece. After this relative movement, the workpiece is then rotated about the center in a second direction, opposite the first direction, while the ion beam is directed toward the second position, so as to process a remainder of the outer portion of the workpiece. In certain embodiments, the workpiece is then moved relative to the ion beam so that the ion beam is directed back to the first position, so that the sequence may be repeated one or more times.

While the above description discloses the rotation of the workpiece 10, it is also possible that the workpiece 10 remains fixed in place, and the ion beam 20 moves. Thus, rotation of the workpiece 10 relative to the ion beam 20, no matter how accomplished, causes the selective processing of the outer portion 40.

The embodiments described above in the present application may have many advantages. As described above, many semiconductor processes exhibit some non-uniformity along the radial direction. The methods described herein provide a way to selective process the outer portion of the workpiece to compensate for or counteract these non-uniformities. Further, the selective processing described herein may be performed a plurality of times, allowing further refinement, which may result in improved uniformity.

In addition, the ability to selectively process the outer portion of the workpiece may allow other semiconductor processes to have increased degree of radial non-uniformity. Further, by positioning the ion beam that performs the selective processing such the ion beam extends across the workpiece, the uniformity of the selective process may be more tightly controlled.

Further, the present system and method is operable for any ion implantation system in which the platen may not be capable of rotating 360°. In fact, the system and method are operable as long as the platen is capable of rotation of at least 180°.

In summary, the workpiece may be more uniformly processed by the incorporation of the selective processing described herein. Thus, issues, such as increased deposition along the outer edge or reduced ion dose along the outer edge, can be rectified by the present embodiments.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of processing a workpiece, comprising:

rotating the workpiece about a center in a first direction while a ribbon ion beam is directed toward a first position, where the ribbon ion beam extends beyond an outer edge of the workpiece at two first locations and the first position is a predetermined distance from the outer edge of the workpiece, so as to process a portion of an outer portion of the workpiece while the workpiece is rotating, wherein the outer portion is defined as an annular ring having a width equal to the predetermined distance;

moving the workpiece laterally relative to the ribbon ion beam so as to direct the ribbon ion beam toward a second position on the workpiece, where the ribbon ion beam extends beyond an outer edge of the workpiece at two second locations and the second position is on the opposite side of the center as the first position and is the predetermined distance from the outer edge of the workpiece; and rotating the workpiece about the center in a second direction, opposite the first direction, while the ribbon ion beam is directed toward the second position, so as to process a remainder of the outer portion of the workpiece while the workpiece is rotating, such that only the outer portion of the workpiece is processed.

2. The method of claim 1, wherein the workpiece is rotated at least 180° in the first direction and at least 180° in the second direction.

3. The method of claim 1, wherein the ribbon ion beam does not impact the workpiece during the moving.

4. The method of claim 3, wherein the ion ribbon beam is blocked by a Faraday cup or a shadow mask during the moving.

5. The method of claim 3, wherein the ribbon ion beam is blanked during the moving.

6. The method of claim 5, wherein a voltage applied to an extraction electrode is modified to blank the ribbon ion beam.

7. The method of claim 1, wherein the rotating in the first direction, the moving, and the rotating in the second direction are repeated.

8. The method of claim 1, wherein the rotating is performed at a constant rotational speed.

9. The method of claim 1, wherein the rotating is performed at a varying rotational speed.

10. An ion implantation system, comprising:

an ion source from which a ribbon ion beam is extracted;

a platen, adapted to hold a workpiece, which is configured to move laterally and rotationally;

a controller, in communication with the platen, and configured to:

direct the ribbon ion beam toward a first position on the workpiece, where the ribbon ion beam extends beyond an outer edge of the workpiece at two first locations and the first position is a predetermined distance from the outer edge of the workpiece;

rotate the workpiece about a center in a first direction while the ribbon ion beam is directed toward the first position, so as to process a portion of an outer portion of the workpiece while the workpiece is rotating, wherein the outer portion is defined as an annular ring having a width equal to the predetermined distance;

move the workpiece laterally relative to the ribbon ion beam so as to direct the ribbon ion beam toward a second position on the workpiece, where the ribbon ion beam extends beyond an outer edge of the workpiece at two second locations and the second position is on the opposite side of the center as the first position and is the predetermined distance from the outer edge of the workpiece; and rotate the workpiece about the center in a second direction, opposite the first direction, while the ribbon ion beam is directed toward the second position, so as to process a remainder of the outer portion of the workpiece while the workpiece is rotating, wherein a width of the outer portion is determined by the predetermined distance and only the outer portion of the workpiece is processed.

11. The ion implantation system of claim 10, wherein the ribbon ion beam is prevented from impacting the workpiece while the workpiece is moved relative to the ribbon ion beam.

12. The ion implantation system of claim 11, wherein the controller actuates a Faraday cup or a shadow mask to block the ribbon ion beam during the moving.

13. The ion implantation system of claim 11, wherein the controller modifies a parameter of the ion source so that the ribbon ion beam is blanked during the moving.

14. The ion implantation system of claim 10, wherein the workpiece is rotated at least 180°.

15. The ion implantation system of claim 10, wherein the workpiece is rotated at a varying rotational speed.

16. The ion implantation system of claim 10, wherein the workpiece is rotated at a constant rotational speed.

17. The ion implantation system of claim 10, wherein the directing, the rotating in the first direction, the moving and the rotating in the second direction are repeated so that the workpiece is rotated an integral number of rotations.

18. An ion implantation system, comprising:

an ion source from which a ribbon ion beam is extracted;

a platen, adapted to hold a workpiece, which is configured to move laterally and rotationally;

a controller, in communication with the platen, and configured to:

direct the ribbon ion beam toward a first position on the workpiece, where the ribbon ion beam extends beyond an outer edge of the workpiece at two first locations and the first position is a predetermined distance from the outer edge of the workpiece, wherein the predetermined distance is between 1 and 30 mm;

rotate the workpiece 180° about a center in a first direction while the ribbon ion beam is directed toward the first position, so as to process a portion of an outer portion of the workpiece while the workpiece is rotating;

prevent the ribbon ion beam from impacting the workpiece while moving the workpiece laterally relative to the ribbon ion beam so as to direct the ribbon ion beam toward a second position on the workpiece, where the ribbon ion beam extends beyond an outer edge of the workpiece at two second locations and the second position is on the opposite side of the center as the first position and is the predetermined distance from the outer edge of the workpiece; and rotate the workpiece 180° about the center in a second direction, opposite the first direction, while the ribbon ion beam is directed toward the second position, so as to process a remainder of the outer portion of the workpiece while the workpiece is rotating, wherein a width of the outer portion is determined by the predetermined distance and only the outer portion of the workpiece is processed.

19. The ion implantation system of claim 18, wherein the ion source comprises one or more electrodes to manipulate the ribbon ion beam, and the controller modifies a voltage applied to the one or more electrodes to prevent the ribbon ion beam from impacting the workpiece.

20. The ion implantation system of claim 18, further comprising a Faraday cup or a shadow mask, wherein the controller moves the Faraday cup or the shadow mask in a path of the ribbon ion beam to prevent the ribbon ion beam from impacting the workpiece.

* * * * *